United States Patent [19]

Doan et al.

[11] Patent Number: 5,032,545

[45] Date of Patent: Jul. 16, 1991

[54] PROCESS FOR PREVENTING A NATIVE OXIDE FROM FORMING ON THE SURFACE OF A SEMICONDUCTOR MATERIAL AND INTEGRATED CIRCUIT CAPACITORS PRODUCED THEREBY

[75] Inventors: Trung T. Doan; Tyler A. Lowrey, both of Boise, Id.

[73] Assignee: Micron Technology, Inc., Boise, Id.

[21] Appl. No.: 605,748

[22] Filed: Oct. 30, 1990

[51] Int. Cl.$^5$ ............................................. H01L 00/00
[52] U.S. Cl. .................................... 437/242; 437/241; 437/243; 437/244; 437/235; 437/939
[58] Field of Search ............... 437/241, 242, 243, 244, 437/939

[56] References Cited

U.S. PATENT DOCUMENTS

| | | | |
|---|---|---|---|
| 4,277,320 | 7/1981 | Beguwala et al. | 437/242 |
| 4,298,629 | 11/1981 | Nozaki et al. | 437/121 |
| 4,855,258 | 8/1989 | Allman et al. | 437/241 |
| 4,906,328 | 3/1990 | Freeman et al. | 456/668 |
| 4,962,065 | 10/1990 | Brown et al. | 437/242 |

Primary Examiner—Brian E. Hearn
Assistant Examiner—Trung Dang
Attorney, Agent, or Firm—William J. Bethurum

[57] ABSTRACT

A process for forming silicon nitride layers on silicon substrates which includes initially heating the silicon substrates in a rapid thermal processor and in a substantially oxygen-free and residual moisture free environment to form a thin $Si_3N_4$ layer directly on the silicon surface which is free of any measurable native $SiO_2$ thereon. Then, the nitridized wafers are transferred into a conventional nitride furnace where the thin $Si_3N_4$ layers may be increased in thickness by a desired amount. Typically, the initial or first $Si_3N_4$ layer thickness will be about 10-30 angstroms and the second $Si_3N_4$ layer will be on the order of 80 angstroms or more to form a composite $Si_3N_4$ layer of about 100-150 angstroms in total thickness. This novel process and the high dielectric constant integrated circuit capacitors produced thereby are highly useful in the manufacture of certain very large scale integrated circuit (VLSI) components such as dynamic random access memories and the like.

16 Claims, 1 Drawing Sheet

PROCESS FOR PREVENTING A NATIVE OXIDE FROM FORMING ON THE SURFACE OF A SEMICONDUCTOR MATERIAL AND INTEGRATED CIRCUIT CAPACITORS PRODUCED THEREBY

TECHNICAL FIELD

This invention relates generally to the surface treatment of semiconductor materials to form dielectric layers thereon. More particularly, this invention is directed to the use of such surface treatment in the fabrication of improved capacitors fabricated in very large scale integrated circuits (VLSI).

BACKGROUND ART

In the manufacture of large scale and very large scale integrated circuits, including semiconductor memories such as high density dynamic random access memories (DRAMs), it is frequently desirable to deposit insulating layers directly on the surface of a semiconductor substrate or wafer being processed so as to form high quality inorganic dielectric layers which may be utilized to form storage capacitors. These integrated circuit type storage capacitors are useful and are required in large numbers, for example, as an AC coupled component for the bit lines and word lines in dynamic random access memory integrated circuits.

As is well known, the capacitance of a dielectric layer or strip is proportional to the dielectric constant, $\epsilon$, of the layer material times the capacitor plate area, A, divided by the thickness, d, of the dielectric layer. Thus, in the formation of high capacitance storage devices used in the construction of high density integrated circuits where the above capacitance plate area or "A" dimension is very limited, it becomes desirable to use a very thin dielectric capacitor layer with a small "d" dimension of a high dielectric constant material in order to maximize the $\epsilon \cdot A/d$ quotient.

In the fabrication of these dielectric capacitor layers on the surfaces of silicon substrates, silicon nitride, $Si_3N_4$, has been frequently used as the capacitor dielectric material, and this inorganic dielectric material has a relatively high dielectric constant $\epsilon$ which is approximately twice that of silicon dioxide, $SiO_2$. Therefore, it is clearly desirable in the manufacture of certain types of integrated circuits to form a single thin layer of only silicon nitride directly on the surface of a silicon substrate and which is then operative to function as the storage node of an integrated circuit capacitor element, such as a storage capacitor of a DRAM memory cell.

However, it has not been heretofore possible to form only $Si_3N_4$ on the silicon surface using conventional prior art silicon processing techniques. The reason is that these conventional silicon processing techniques could not be carried out in such a manner as to prevent the formation of a thin native silicon dioxide layer directly on the exposed silicon surface before one could commence depositing the desirable higher dielectric constant silicon nitride layer thereon to form the capacitor dielectric. Thus, the presence of this undesirable native silicon dioxide, $SiO_2$ layer will simultaneously decrease the value of the dielectric constant $\epsilon$, increase the value of the total dielectric layer thickness "d" and have the net resulting effect of decreasing the $\epsilon \cdot A/d$ capacitance quotient value and thus charge storage capability of the integrated circuit capacitor being fabricated.

The only known prior art attempt to solve the above native oxide problem and prior effort toward preventing the formation of this native thermal oxide on the treated silicon surface is to pump and flush oxidizing gases and other residual elements out of conventional low pressure chemical vapor deposition (LPCVD) nitride furnaces using conventional vacuum pumping techniques and flushing with standard inert carrier gases. However, due to the nature, size and mode of operation of these LPCVD nitride furnaces, these attempts have failed to solve the above problem of forming a thin native oxide layer on the silicon surface prior to the initiation of a silicon nitride deposition thereon. That is, these LPCVD nitride furnaces are normally operated so that there is always some oxygen and moisture residue therein.

When the reactant gases are pumped into one end of the LPCVD nitride furnace and the silicon wafers are introduced into the other end thereof in preparation for $Si_3N_4$ deposition process, it becomes virtually impossible to prevent the formation of this thin native $SiO_2$ layer on the silicon wafers being treated. This thin $SiO_2$ native oxide layer is formed as a result of the fact that the LPCVD nitride furnace is operated at an elevated temperature on the order of about 800° C. or greater in the presence of some oxygen and moisture residue in the main reaction chamber of the LPCVD system.

DISCLOSURE OF INVENTION

The general purpose and principal object of the present invention is to provide a straightforward, economical and reliable process which is capable of preventing the formation of this native oxide $SiO_2$ layer on a silicon surface upon which it is desired to form only a silicon nitride dielectric layer. In the accomplishment of this object and purpose, it has been discovered that the above undesirable layer of native silicon dioxide can be eliminated by the use of a rapid thermal processing (RTP) process in combination with and prior to the use of conventional LPCVD nitride deposition processes. The silicon wafers being treated are initially loaded onto an appropriate wafer carrier and then introduced into a rapid thermal processor. The rapid thermal processor is described in some detail below and is a unit having a quartz heater tube therein and has a relatively small volume, of typically about three (3) liters or less.

The rapid thermal processing unit containing the silicon wafers is initially flushed with a chosen inert gas such as nitrogen for about 10-20 seconds in order to remove all residual oxygen and moisture from the relatively small reaction chamber thereof. Next, ammonia, $NH_3$, is passed through the RT reaction chamber at about twenty (20) liters per minute until a stabilized gas ambient condition is attained in the RTP reaction chamber. Then, the reaction chamber of the RTP processing unit is rapidly heated up to a predetermined elevated temperature on the order of about 1000° C. within a time of between 10 to 20 seconds.

The chemical reaction which takes place in the RTP reaction chamber produces a thermal decomposition of the ammonia, $NH_3$, therein and causes the nitrogen therein to react with the surface of the silicon wafers to thereby form thin silicon nitride layers thereon of a thickness on the order of 10 to 30 angstroms. This thin layer of silicon nitride may be formed within about 15 seconds after the initial $Si_3N_4$ deposition begins, where-after the wafers are removed from the RTP processor. Then, the nitridized wafers are transferred into a conventional LPCVD nitride furnace where either silane, SiH$_4$, and ammonia, NH$_3$, or dichlorosilane, SiCl$_2$H$_2$, and ammonia are heated to an elevated temperature greater than about 700° C. for a predetermined time sufficient to form typically another 80 angstroms or so of silicon nitride on the 10–30 angstrom surface layer previously formed in the rapid thermal processor.

Thus, briefly described, the novel process combination of steps for forming the complete approximately 100–150 angstrom thick composite silicon nitride dielectric layer on the surface of a silicon substrate includes the steps of:

a. cleaning the surface of a silicon wafer to remove any native oxide thereon, b. inserting the cleaned silicon wafer into a rapid thermal processing (RTP) chamber which is cooled down to a predetermined low initial temperature and then flushed with a chosen inert gas such as nitrogen to remove substantially all residual oxygen molecules and residual moisture therefrom, c. passing a nitrogen-containing gas such as N$_2$ or ammonia, NH$_3$, through the rapid thermal processing chamber at a controlled flow rate until a gas stabilized condition and ambient concentration is attained within the RTP chamber, d. heating the rapid thermal processing chamber to a predetermined elevated temperature within a predetermined time in the presence of nitrogen containing gas to form a first, relatively thin layer of silicon nitride, Si$_3$N$_4$, directly on the surface of the silicon wafer, and then e. transferring the nitridized silicon wafer from the rapid thermal processing chamber to a conventional nitride furnace wherein the thickness of the first silicon nitride layer is extended by a second and subsequently formed silicon nitride layer to a total thickness on the order of typically about 100–150 angstroms and suitable for use as the dielectric inner layer of integrated circuit capacitors and the like.

The present invention is also directed to any integrated circuit or other equipment and article of manufacture made using the above novel process.

The above brief summary of the present invention, together with its many attendant features and advantages will become better understood with reference to the following description of the accompanying drawing.

DETAILED DESCRIPTION OF THE PREFERRED EMBODIMENT

Figure 1:
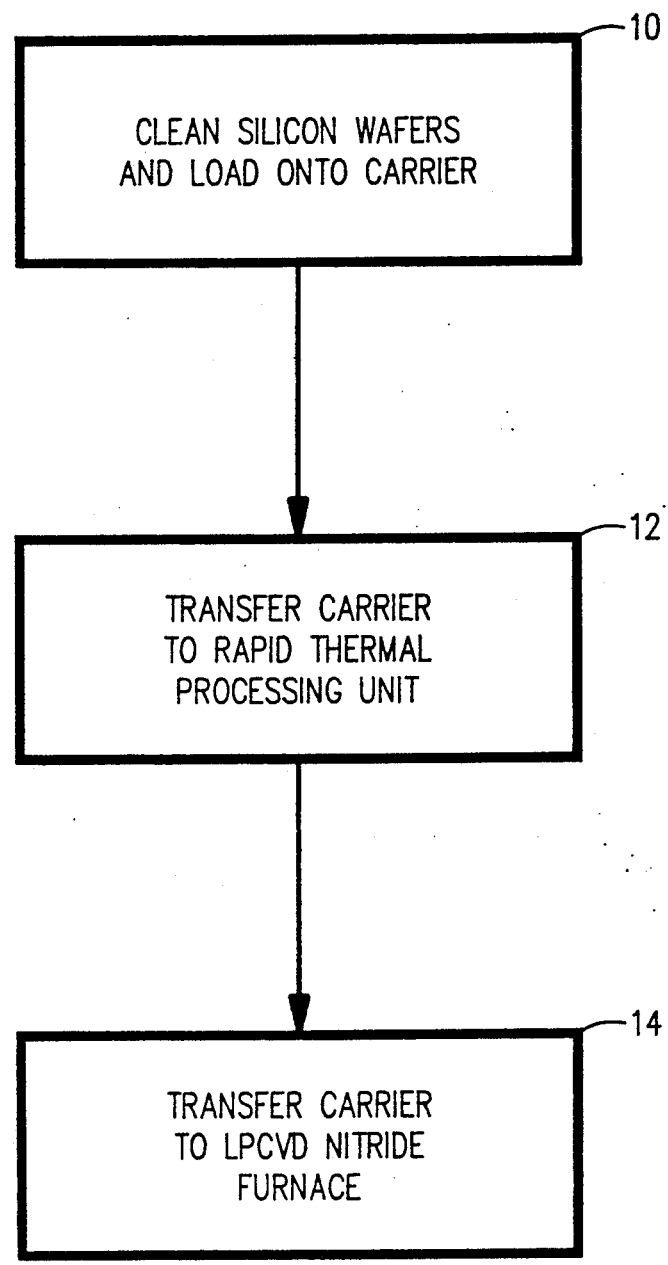
FIG. 1 is a functional block diagram illustrating the process flow sequence according to the present invention.

Referring now to FIG. 1, the process described and claimed herein comprises wafer cleaning and wafer carrier loading steps 10, a rapid thermal processing step 12, and a subsequent conventional nitridation step 14. In accordance with a preferred embodiment of this invention, the rapid thermal processor used in carrying out step 12 is chosen as a relatively small unit of about three (3) liters or less in volume and will have a wide area lamp (not shown) mounted above a facing support member for receiving a wafer tray or carrier thereon. In operation, a wafer carrier or tray of silicon wafers is loaded into the RTP unit used in step 12, and the RTP unit is water cooled down to an initial temperature of about 50° C. or less and flushed with nitrogen gas at a gas flow rate of about twenty (20) liters per minute for about 20 seconds until substantially all residual oxygen molecules and residual moisture are removed from the inside of the RTP unit.

Then a chosen nitrogen containing reactant gas such as ammonia is passed through the RTP chamber until a gas ambient stabilized condition is attained therein. An important feature and aspect of using the rapid thermal processing unit in the present nitridation process is that since this RTP unit is only about three (3) liters or less in total reaction chamber volume, and significantly less in volume than conventional LPCVD nitridation furnaces and their associated long reaction tubes, the RTP reaction chambers can be flushed and purged substantially free from all residual oxygen and moisture before the initial Si$_3$N$_4$ deposition step begins. Then, once the oxygen and residual moisture flushing or purging step has been completed, this moisture and oxygen free environment is continued to be maintained within the RTP chamber in step 12 by the continued passing therethrough of the nitrogen-containing reactant gas such as ammonia during the subsequent initial Si$_3$N$_4$ thermal growth step described below.

Next, the heat lamp in the RTP unit is rapidly heated to an elevated temperature of about 1000° C. in about 10 seconds and is maintained at this elevated temperature level for about 15 seconds in order to thermally grow and form a thin layer of Si$_3$N$_4$ on the exposed surfaces of the silicon wafers to a thickness on the order of 10–30 angstroms. The Si$_3$N$_4$ layer is thermally formed on the surfaces of the silicon wafers by reacting ammonia with the silicon surfaces in accordance with the following expression:

$$4NH_3 + 3Si \xrightarrow{1000°} Si_3N_4 + 6H_2$$

Next, the wafer boat or carrier member containing the nitridized wafers is removed from the RTP chamber in step 12 of FIG. 1 and is then transferred into a conventional LPCVD nitride furnace in step 14 as previously described to deposit another 80 or more angstroms of Si$_3$N$_4$ on the RTP deposited Si$_3$N$_4$ layer formed in the RTP unit in step 12 to complete the Si$_3$N$_4$ dielectric layer deposition and formation process.

Advantageously, the process described above with reference to step 12 is carried out using a rapid thermal processor (RTP) unit of the type manufactured by Peak Systems, Inc. of 3550 W. Warren Avenue, Freemont, Calif., 94538 and sold under their tradename ALP 6000. This RTP system is described in a brochure made available by Peak Systems, Inc. entitled *ALP 6000* and is also further described in another brochure published by Peak Systems, Inc. entitled *Peak Systems. Inc. 6000/6500*, both incorporated herein by reference. This RTP processing unit which is used in step 12 of FIG. 1 is even further described in more detailed chemical terms by T. J. Stultz in a technical publication entitled "Rapid Thermal Processing: Equipment Issues For High Volume Production Environments", also made available by Peak Systems, Inc. Both this Stultz publication as well as all of the references cited and footnoted therein are incorporated herein by reference.

Rapid thermal processors of the type described above and made available by Peak Systems, Inc. may be operated with a high degree of process control over temperature-time cycling with corresponding closely controlled repeatable results in the silicon nitride layer characteristics and layer thicknesses from batch to batch in a large scale manufacturing process. The degree of this control over the $Si_3N_4$ dielectric layer deposition on silicon wafer surfaces depends mainly upon the characteristics of the heat source and upon the reactor chamber design. An important property of the RTP's heat source is that the thermal mass of an arc heat lamp used therein is negligible. This in turn means that the output power of this heat lamp can be changed very rapidly. Tungsten-halogen lamps have been conventionally used in these RTP processing units, but the thermal mass associated with the tungsten filament of these lamp limits the rate at which the lamp radiation can be increased or decreased.

Proper design of the reaction chamber of the RTP processing unit used in step 12 is essential to achieving optimum performance of rapid thermal processing as a cold-wall process. The maximum temperature of the chamber walls should be no higher than 150–200° C., and this process constraint can be easily accomplished by the use of water cooling on all of the internal surfaces of the RTP reaction chamber, thereby ensuring that the RTP chamber is not a source of contamination to the silicon wafers being processed. This condition also presents a constant thermal background for the wafers being processed. In systems which employ two-sided tungsten-halogen lamp heating, at high temperatures the quartz lamp envelope of the RTP heater element can be heated up to 600° C. by the longer wavelength radiation emitted by the lamp and the radiation reflected by the wafer being processed. If the quartz lamp is not actively cooled, the chamber RTP will have thermal memory effects which make it necessary to preheat the quartz lamp by processing several dummy wafers before a stable process temperature-time profile can be obtained. Furthermore, the wafer cooling rates within the RTP processing unit can be significantly reduced by providing this high chamber background temperature, resulting in reduced throughput due to the much longer cooling time.

Careful consideration must also be given to the gas purge system for the RTP processing unit used in step 12 of FIG. 1. Gas flows must be arranged so that the thermal uniformity in the system is not affected by non-uniform gas flow rates and ensure that uniform processing can be achieved. Minimizing the chamber volume will reduce the purge time and the gas consumption rates in the RTP unit, and the RTP chamber materials should also be compatible with corrosive and reactive gases.

In step 14 of FIG. 1, the nitridized silicon wafers are transferred into a conventional nitride furnace wherein an additional or second coating of $Si_3N_4$ is deposited on the first coating of $Si_3N_4$ in accordance with the following expression:

$$3SiCl_2H_2 + 4NH_4 \xrightarrow{700°C} Si_3N_4 + 6HCl + 6H_2$$

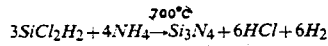

This above LPCVD reaction of dichlorosilane and ammonia is generally well known in the art and is described in more detail, for example, by Wolf and Tauber in a book entitled *Silicon Processing For The VLSI Era*, Vol. 1, "Process Technology", Lattice Press, at pages 191–194, also incorporated herein by reference.

Various modifications may be made in and to the above described embodiment without departing from the spirit and scope of this invention. For example, the present invention is not limited to the use of the specifically disclosed rapid thermal processors described above and may be practiced with other and different types of rapid thermal processors. In addition, chemical reactions other than those combining dichlorosilane and ammonia may be used in conventional nitride furnaces in order to form the second layer of $Si_3N_4$ on top of the first formed $Si_3N_4$ layer. Furthermore, it is entirely possible for certain integrated circuit manufacturing processes that the rapid thermal processing unit used in step 12 of FIG. 1 can be used as the sole silicon nitride deposition process utilized to form a particular type of integrated circuit capacitor. For example, the RTP unit used in step 12 of FIG. 1 may be enlarged somewhat in reaction chamber volume greater than the above described three (3) liters to manufacture certain types of custom silicon nitride integrated circuit capacitors which would not require subsequent $Si_3N_4$ processing in conventional LPCVD nitridation furnaces.

Accordingly, the above described and other process modifications are clearly within the scope of the following appended claims.

We claim:
1. A process for forming a silicon nitride, $Si_3N_4$, dielectric layer on the surface of a silicon substrate while substantially eliminating the formation of a native silicon oxide or silicon dioxide on the silicon substrate surface, which includes the steps of:
   a. cleaning said surface of said silicon substrate to remove any native oxide thereon,
   b. inserting the cleaned silicon substrate into a rapid thermal processing chamber which is cooled down to a predetermined low initial temperature and flushed to remove substantially all oxygen molecules and residual moisture therefrom, and
   c. heating said rapid thermal processing chamber to a predetermined elevated temperature within a predetermined time in the presence of a nitrogen-containing reactant gas to thereby thermally decompose said nitrogen-containing reactant gas and form a thin layer of silicon nitride on the surface of said substrate.

2. The process defined in claim 1 wherein said nitrogen containing reactant gas is either ammonia, $NH_3$, or nitrogen, $N_2$.

3. The process defined in claim 1 wherein said rapid thermal processing chamber is initially flushed with an inert gas such as nitrogen to remove substantially all oxygen molecules and residual moisture therefrom, and said silicon substrate is heated in said rapid thermal processing chamber to an elevated temperature on the order of about 1000° C. within about 10 to 20 seconds to form a thin layer of silicon nitride of approximately 10–30 angstroms in thickness on the surface of said silicon substrate.

4. The process defined in claim 3 wherein said nitrogen containing reactant gas is either ammonia, $NH_3$, or nitrogen, $N_2$.

5. The process defined in claim 4 which further includes transferring said silicon substrate processed in said rapid thermal processing chamber to a conventional nitride furnace and forming thereon an additional silicon nitride layer on the order of about 80 angstroms or more in thickness so that the total silicon nitride dielectric layer thickness is formed to a value on the order of about 50–150 angstroms.

6. A process for forming a thin layer of silicon nitride, Si$_3$N$_4$, wherein said layer is formed by:
   a. introducing a silicon wafer into a small heating chamber,
   b. flushing said heating chamber to remove substantially all residual oxygen and moisture therefrom, and
   c. passing a nitrogen-containing reactant gas comprising nitrogen, N$_2$, or ammonia, NH$_3$, through said small heating chamber at a controlled flow rate until a gas stabilized condition and ambient oxygen-free nitrogen concentration is attained within said heating chamber, and
   d. rapidly heating said silicon wafer in said heating chamber in the presence of said nitrogen-containing reactant gas to a predetermined elevated temperature within a predetermined period of time to form said Si$_3$N$_4$ layer thereon by the thermal reaction of nitrogen with the surface of said silicon wafer.

7. The process defined in claim 6 wherein said silicon wafer is inserted into a relatively small heating chamber having a volume on the order of about three (3) liters, whereby said relatively small heating chamber is adapted to be purged and flushed substantially free of all residual oxygen and moisture before it is rapidly heated up to a predetermined elevated reaction temperature.

8. The process defined in claim 7 wherein said small heating chamber is contained within a rapid thermal processing unit.

9. The process defined in claim 6 wherein said Si$_3$N$_4$ layer is formed in accordance with the following expression:

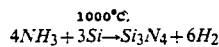
$$4NH_3 + 3Si \rightarrow Si_3N_4 + 6H_2$$

10. The process defined in claim 10 which further includes forming a second layer of Si$_3$N$_4$ on top of said surface Si$_3$N$_4$ layer by reacting dichlorosilane and ammonia at a predetermined elevated temperature in the presence of said silicon wafer, whereby the $\epsilon \cdot A/d$ capacitance defining ratio for the combination of said first and second silicon nitride layers is maximized.

11. A process for forming thin film layers of silicon nitride, Si$_3$N$_4$, on the surfaces of silicon substrates without forming thereon a native silicon oxide or silicon dioxide layer to any significant degree, which comprises the steps of:
   a. inserting said wafers in a small rapid thermal processing (RTP) unit which is flushed with an inert purge gas and thereafter filled with a nitrogen-containing reactant gas,
   b. rapidly heating said reactant gas in the presence of said wafers to a predetermined elevated temperature within a predetermined time, and thereby
   c. thermally decomposing said reactant gas to thereby react elemental nitrogen with silicon at the surfaces of said wafers to form thin layers of silicon nitride, Si$_3$N$_4$, thereon.

12. The process defined in claim 11 wherein said silicon wafers are heated in said rapid thermal processing unit to an elevated temperature on the order of about 1000° C. within about 10 to 20 seconds.

13. The process defined in claim 12 wherein said thin layers of silicon nitride, Si$_3$N$_4$, are formed in accordance with the following expression:

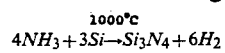
$$4NH_3 + 3Si \rightarrow Si_3N_4 + 6H_2$$

14. The process defined in claim 13 which further includes forming a second layer of silicon nitride, Si$_3$N$_4$, on top of the first formed layers of silicon nitride by reacting dichlorosilane and ammonia at a predetermined elevated temperature in the presence of said silicon wafers, whereby the $\epsilon \cdot A/d$ capacitance defining quotient for the combination of said first and second silicon nitride layers is maximized.

15. The process defined in claim 9 wherein said silicon wafers are heated in a rapid thermal processing unit to an elevated temperature on the order of about a 1000° C. or greater within about ten to twenty seconds.

16. The process defined in claim 10 wherein said silicon wafers are heated in a rapid thermal processing unit to an elevated temperature on the order of about 1000° C. or greater within about ten to twenty seconds.

* * * * *